(12) United States Patent
Ko

(10) Patent No.: US 7,422,951 B2
(45) Date of Patent: Sep. 9, 2008

(54) METHOD OF FABRICATING SELF-ALIGNED BIPOLAR TRANSISTOR

(75) Inventor: Kwang Young Ko, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 237 days.

(21) Appl. No.: 11/022,655

(22) Filed: Dec. 28, 2004

(65) Prior Publication Data

US 2005/0142787 A1 Jun. 30, 2005

(30) Foreign Application Priority Data

Dec. 30, 2003 (KR) .................. 10-2003-0101008

(51) Int. Cl.
*H01L 21/331* (2006.01)

(52) U.S. Cl. .................. 438/309; 438/310; 438/313; 438/318; 438/320

(58) Field of Classification Search .................. 438/309, 438/310, 313, 318, 320, 322, 364, 329
See application file for complete search history.

(56) References Cited

U.S. PATENT DOCUMENTS

| 6,235,568 | B1 * | 5/2001 | Murthy et al. | .............. 438/231 |
| 6,372,590 | B1 * | 4/2002 | Nayak et al. | ............... 438/305 |
| 2004/0063263 | A1 * | 4/2004 | Suzuki et al. | ............... 438/197 |

* cited by examiner

*Primary Examiner*—Hsien-ming Lee
(74) *Attorney, Agent, or Firm*—Finnegan, Henderson, Farabow, Garrett & Dunner, L.L.P.

(57) ABSTRACT

The present invention provides a method of fabricating a self-aligned bipolar transistor, by which the fabricating method can be simplified by forming P+ and N+ junctions by self-alignment and by which device reliability can be enhanced. The present invention includes the steps of forming a well in a substrate isolated by a device isolation layer, forming a polysilicon gate on the substrate, forming an insulating layer on the substrate, forming a sidewall spacer on lateral sides of the polysilicon gate by etching the insulating layer, forming a P$^+$ ion implanted region in the substrate, forming an N$^+$ ion implanted region in the substrate, and forming silicide on the P$^+$ and N$^+$ ion implanted regions.

3 Claims, 5 Drawing Sheets

METHOD OF FABRICATING SELF-ALIGNED BIPOLAR TRANSISTOR

This application claims the benefit of the Korean Application No. P2003-0101008 filed on Dec. 30, 2003, which is hereby incorporated by reference.

BACKGROUND OF THE INVENTION

1. Field of the Invention

The present invention relates to a method of fabricating a self-aligned bipolar transistor, in which silicide is formed after completion of impurity ion implantation using a gate polysilicon and sidewall as an ion implantation mask.

2. Discussion of the Related Art

FIGS. 1A to 1C are cross-sectional diagrams for explaining a method of fabricating a self-aligned bipolar transistor according to a related art.

Referring to FIG. 1A, after a device isolation layer 12 has been formed on a substrate 11 provided with a prescribed device, ion implantation is performed on a prescribed area of the substrate 11 to form a well 13.

Subsequently, photoresist is coated on the substrate 11. Exposure and development are carried out on the photoresist to form a photoresist pattern 14 for ion implantation.

Ion implantation is carried out on the substrate using the photoresist pattern 14 as an ion implantation mask to for a $P^+$ ion implanted region 15 and an $N^+$ ion implanted region 16 in the substrate 11.

Referring to FIG. 1B, after the photoresist pattern has been removed from the substrate 11, an oxide layer pattern 17 is formed on the substrate 11.

Subsequently, a silicidation process is carried out on the substrate to form a silicide layer 18 on the exposed portion of the substrate 11.

Referring to FIG. 1C, after the oxide layer pattern has been removed from the substrate 11, a collector 19, an emitter 20, and a base 21 are formed in the well 13 of the substrate 11.

However, the related art bipolar transistor forming method needs a patterning work according a generation rule of a mask to form the emitter, collector, and base junctions and also needs a patterning work for forming silicide selectively on the substrate by photolithography, whereby device reliability can be degraded in case of misalignment occurrence in performing the patterning work.

SUMMARY OF THE INVENTION

Accordingly, the present invention is directed to a method of fabricating a self-aligned bipolar transistor that substantially obviates one or more problems due to limitations and disadvantages of the related art.

An object of the present invention is to provide a method of fabricating a self-aligned bipolar transistor, by which the fabricating method can be simplified by forming $P^+$ and $N^+$ junctions by self-alignment and by which device reliability can be enhanced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a self-aligned bipolar transistor according to the present invention includes the steps of forming a well in a substrate isolated by a device isolation layer, forming a polysilicon gate on the substrate, forming an insulating layer on the substrate, forming a sidewall spacer on lateral sides of the polysilicon gate by etching the insulating layer, forming a $P^+$ ion implanted region in the substrate, forming an $N^+$ ion implanted region in the substrate, and forming silicide on the $P^+$ and $N^+$ ion implanted regions.

Preferably, the sidewall spacer is formed by performing anisotropic etch on the insulating layer.

Preferably, each of the $P^+$ and $N^+$ ion implanted regions is formed by ion implantation using the polysilicon gate and the sidewall spacer as an ion implantation mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2F are cross-sectional diagrams for explaining a method of fabricating a self-aligned bipolar transistor according to the present invention.

Figure 1A:
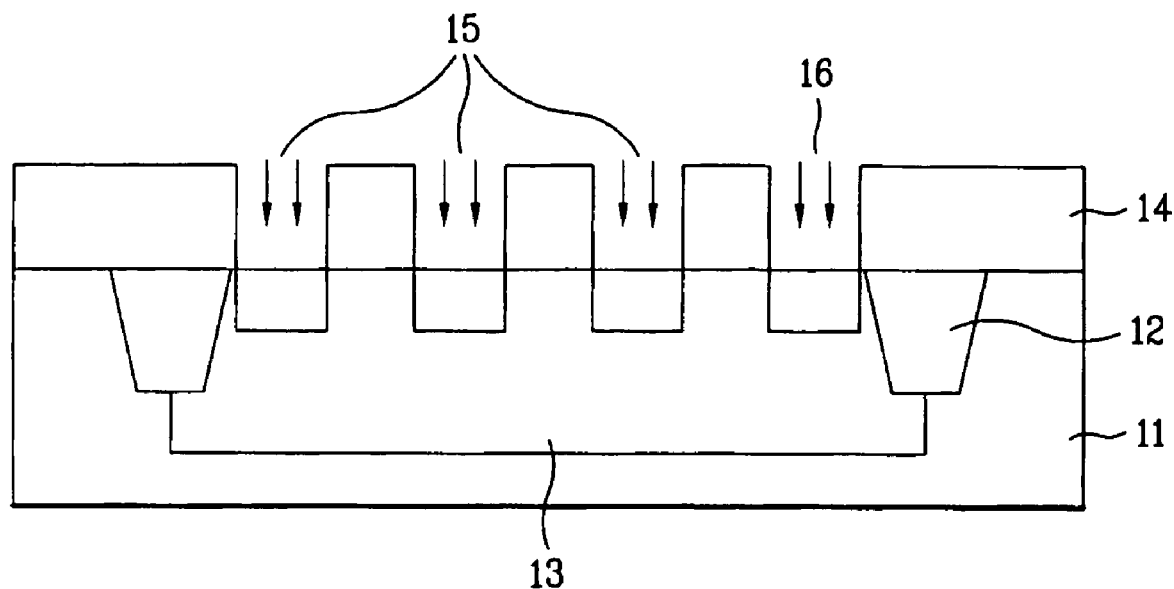
FIGS. 1A to 1C are cross-sectional diagrams for explaining a method of fabricating a bipolar transistor according to a related art.
Figure 1B:
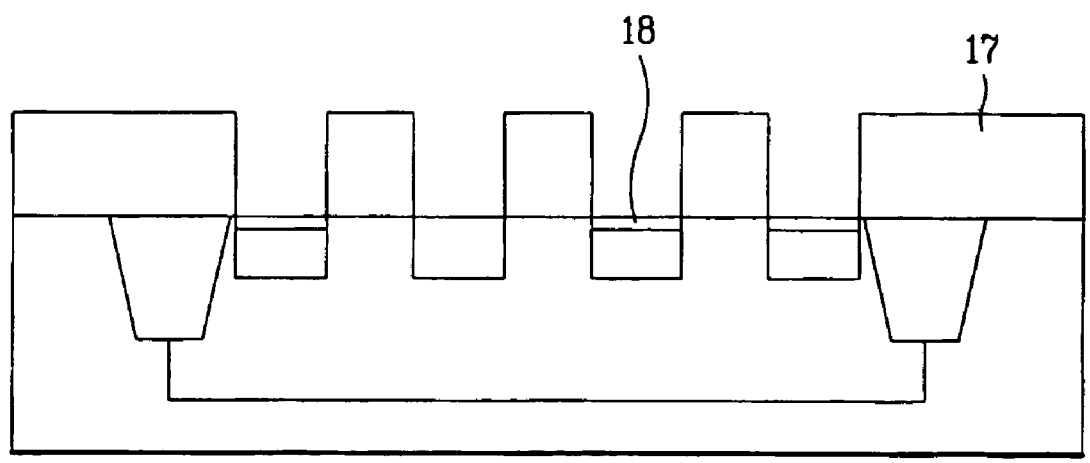
Figure 1C:
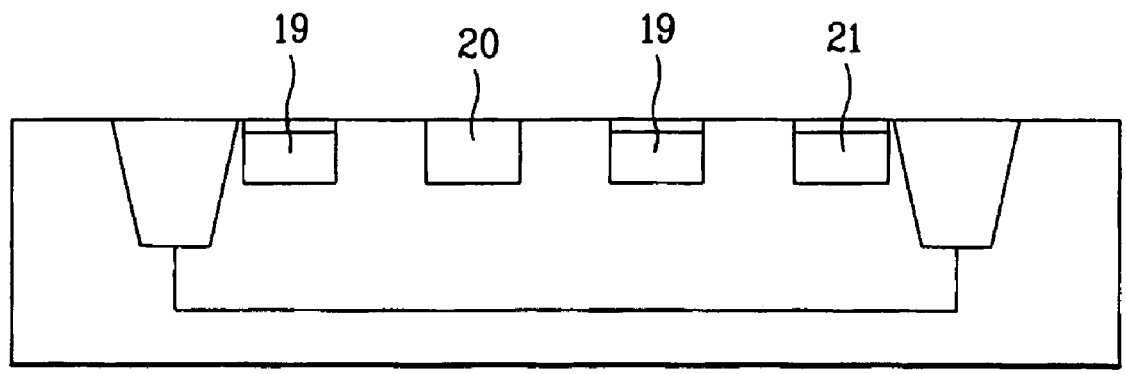
Figure 2A:
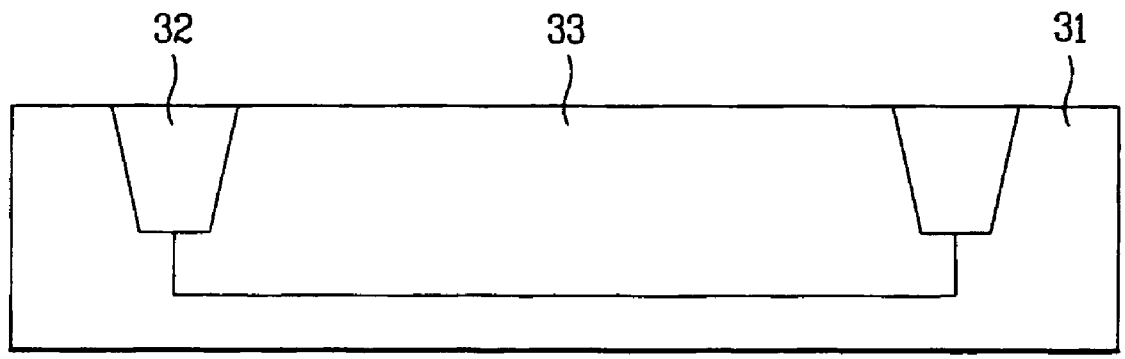
FIGS. 2A to 2F are cross-sectional diagrams for explaining a method of fabricating a self-aligned bipolar transistor according to the present invention.

FIG. 2A shows steps of forming a device isolation layer on a substrate provided with a prescribed device (not shown in the drawing) and forming a well by ion implantation.

Referring to FIG. 2A, photoresist is coated on a substrate 31 provided with a prescribed device (not shown in the drawing). Exposure and development are carried out on the photoresist to form a photoresist pattern. The substrate 31 is then etched using the photoresist pattern as an etch mask to form a trench. The trench is filled up with an isolating material to form a device isolation layer 32.

Subsequently, impurity ions are implanted in a specific area of the substrate to form a well 33. In doing so, a type of the implanted impurity ions is opposite to that of the substrate 31.

Figure 2B:
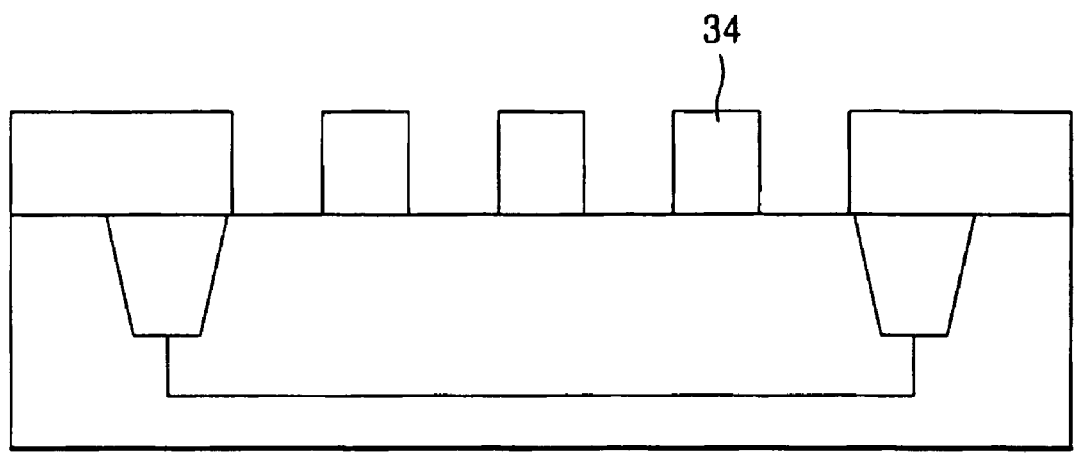

FIG. 2B shows a step of forming polysilicon on the substrate and etching the polysilicon to form a polysilicon gate.

Referring to FIG. 2B, a polysilicon layer is formed on the substrate to define a bipolar area for forming a collector, an emitter, and a base.

After photoresist has been coated on the polysilicon layer, exposure and development are carried out on the photoresist to form a photoresist pattern.

The polysilicon layer is then etched using the photoresist pattern on the polysilicon layer as an etch mask, thereby forming a polysilicon gate 34.

And, the photoresist pattern is removed from the polysilicon gate 34.

Figure 2C:
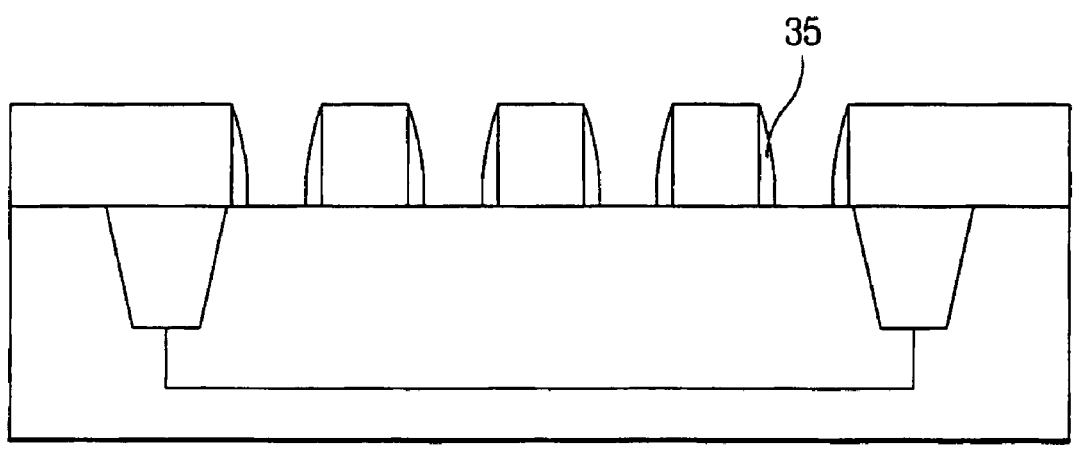

FIG. 2C shows a step of forming an insulating layer on the substrate and etching the insulating layer to form a sidewall spacer.

Referring to FIG. 2C, an insulating layer is deposited over the substrate. In doing so, the insulating layer has excellent step-difference coating performance to remain on lateral sides of the polysilicon gate.

Anisotropic etch is carried out on the insulating layer so that the insulating layer can remain on the lateral sides of the polysilicon gate to form a sidewall spacer 35.

Figure 2D:
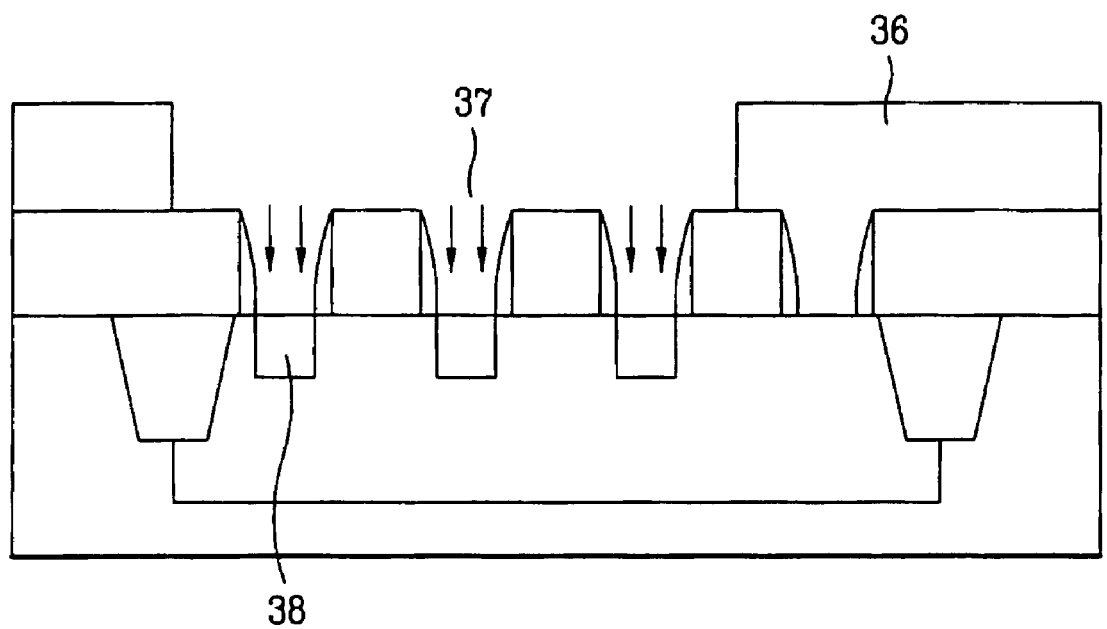

FIG. 2D shows a step of forming a $P^+$ ion implanted region in the substrate.

Referring to FIG. 2D, a mask pattern 36 for forming a $P^+$ ion implanted region is formed on the substrate.

$P^+$ ion implantation 37 is carried out on the substrate to form a $P^+$ impurity ion implanted region 37 using the mask pattern 36 as an ion implantation mask.

Figure 2E:
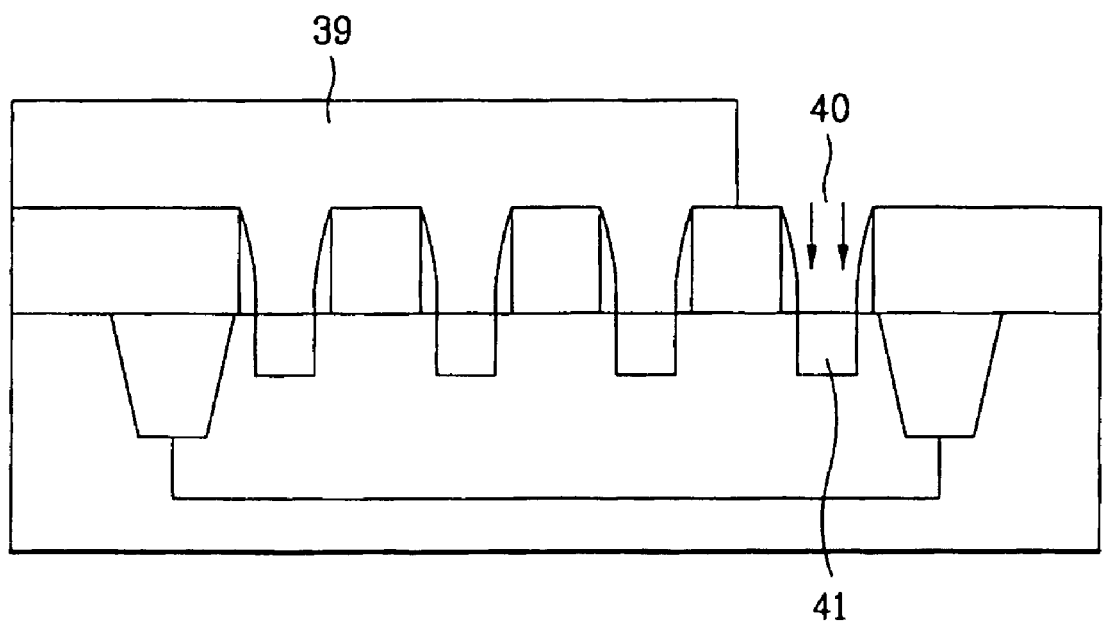

FIG. 2E shows a step of forming an $N^+$ ion implanted region in the substrate.

Referring to FIG. 2E, after the mask pattern has been removed, another mask pattern 39 for forming an $N^+$ ion implanted region is formed on the substrate.

$N^+$ ion implantation 40 is carried out on the substrate to form an $N^+$ impurity ion implanted region 41 using the mask pattern 39 as another ion implantation mask.

Figure 2F:
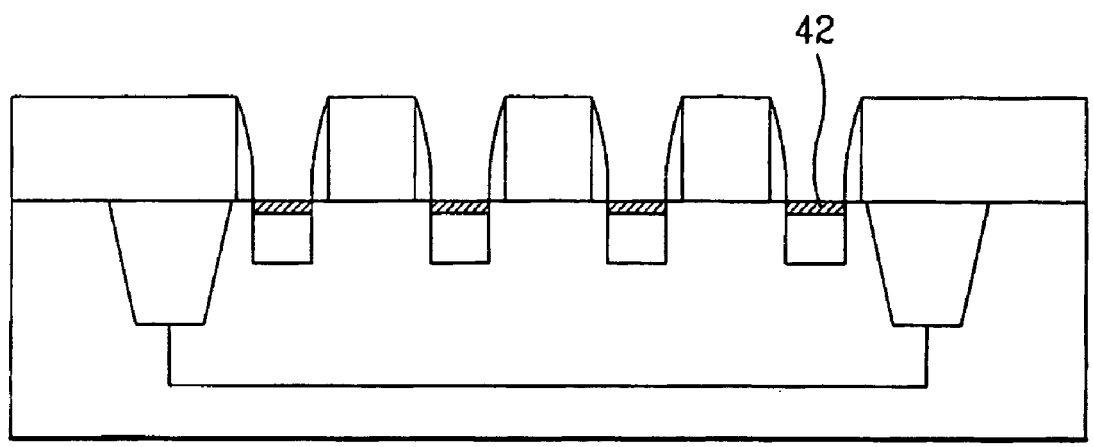

FIG. 2F shows a step of forming silicide on the $P^+$ and $N^+$ ion implanted regions.

Referring to FIG. 2F, after the mask pattern has been removed, a silicide layer 42 is formed on the $P^+$ and $N^+$ ion implanted regions 38 and 41 to complete a self-aligned bipolar transistor.

Accordingly, in the present invention, silicide is formed after completion of impurity ion implantation using the gate polysilicon and sidewall spacer as the ion implantation mask, whereby the fabricating method can be simplified by forming the $P^+$ and $N^+$ junctions by self-alignment and whereby device reliability can be enhanced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a self-aligned bipolar transistor, comprising the steps of:

forming at least one trench in a portion of a first conductive type substrate;

filling the at least one trench with an isolating material to form a device isolation layer;

forming a second conductive type well in the substrate isolated by the device isolation layer, the second conductive type being different from the first conductive type;

forming a polysilicon gate on the substrate;

forming an insulating layer on the substrate;

forming a sidewall spacer on lateral sides of the polysilicon gate by etching the insulating layer;

forming a $P^+$ ion implanted region in a first portion of the second conductive type well;

forming an $N^+$ ion implanted region in a second portion of the second conductive type well, the second portion being separated from the first portion; and forming a silicide layer in contact with the $P^+$ and $N^+$ ion implanted regions.

2. The method of claim 1, wherein the sidewall spacer is formed by performing anisotropic etch on the insulating layer.

3. The method of claim 1, wherein each of the $P^+$ and $N^+$ ion implanted regions is formed by ion implantation using the polysilicon gate and the sidewall spacer as an ion implantation mask.

* * * * *